US011296821B2

(12) United States Patent
Lee et al.

(10) Patent No.: US 11,296,821 B2
(45) Date of Patent: *Apr. 5, 2022

(54) METHOD AND APPARATUS FOR COMMUNICATION

(71) Applicant: MEDIATEK INC., Hsinchu (TW)

(72) Inventors: Chong-You Lee, Hsinchu (TW);
Cheng-Yi Hsu, Hsinchu (TW);
Maoching Chiu, Hsinchu (TW);
Timothy Perrin Fisher-Jeffes, San Jose, CA (US); Ju-Ya Chen, Hsinchu (TW); Yen Shuo Chang, Hsinchu (TW); Wei Jen Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 129 days.

This patent is subject to a terminal disclaimer.

(21) Appl. No.: 16/806,921

(22) Filed: Mar. 2, 2020

(65) Prior Publication Data

US 2020/0204295 A1 Jun. 25, 2020

Related U.S. Application Data

(63) Continuation of application No. 15/888,733, filed on Feb. 5, 2018, now Pat. No. 10,601,544.
(Continued)

(51) Int. Cl.
*H04L 1/00* (2006.01)
*H03M 13/00* (2006.01)
(Continued)

(52) U.S. Cl.
CPC ......... *H04L 1/0041* (2013.01); *H03M 13/116* (2013.01); *H03M 13/1148* (2013.01);
(Continued)

(58) Field of Classification Search
None
See application file for complete search history.

(56) References Cited

U.S. PATENT DOCUMENTS 7,890,834 B2    2/2011  Blankenship
8,527,832 B2    9/2013  Savin
(Continued)

FOREIGN PATENT DOCUMENTS

CN    101183875 A    5/2008
CN    101188428 A    5/2008
(Continued)

OTHER PUBLICATIONS

International Search Report and Written Opinion date Apr. 28, 2018 in PCT/CN2018/075294, citing documents AA-AF & AO-AR therein, 9 pages.
(Continued)

*Primary Examiner* — Guerrier Merant
(74) *Attorney, Agent, or Firm* — Oblon, McClelland, Maier & Neustadt, L.L.P.

(57) ABSTRACT

Aspects of the disclosure provide an apparatus that includes transmitting circuit and processing circuit. The transmitting circuitry is configured to transmit wireless signals. The processing circuitry is configured to encode a set of information bits with a code that is configured for incremental redundancy to generate a code word that includes the information bits and parity bits, buffer the code word in a circular buffer, determine a start position in the circular buffer based on a redundancy version that is selected from a plurality of redundancy versions based on a scenario evaluation of a previous transmission associated with the set of information bits, and transmit, via the transmitting circuitry, a selected portion of the code word from the start position.

16 Claims, 6 Drawing Sheets

Related U.S. Application Data

(60) Provisional application No. 62/455,057, filed on Feb. 6, 2017.

(51) Int. Cl.
  H03M 13/11 (2006.01)
  H04L 1/18 (2006.01)

(52) U.S. Cl.
  CPC ... H03M 13/6306 (2013.01); H03M 13/6362 (2013.01); H04L 1/0009 (2013.01); *H04L 1/1819* (2013.01)

(56) References Cited

U.S. PATENT DOCUMENTS

| | | | |
|---|---|---|---|
| 10,601,544 B2 * | 3/2020 | Lee | .................. H03M 13/1148 |
| 2009/0037797 A1 | 2/2009 | Spencer et al. | |
| 2009/0100309 A1 | 4/2009 | Zheng | |
| 2009/0125774 A1 | 5/2009 | Kim et al. | |
| 2010/0195662 A1 | 8/2010 | Kang | |
| 2011/0078546 A1 | 3/2011 | Spencer et al. | |
| 2011/0078547 A1 | 3/2011 | Spencer et al. | |
| 2012/0110406 A1 | 5/2012 | Sun | |
| 2013/0201886 A1 | 8/2013 | Spencer et al. | |
| 2014/0050148 A1 | 2/2014 | Choi | |
| 2015/0341146 A1 | 11/2015 | Chunlong et al. | |

FOREIGN PATENT DOCUMENTS

| | | | | |
|---|---|---|---|---|
| CN | 101889398 B | | 10/2013 | |
| JP | 2020504932 A | * | 3/2020 | ............ H03M 13/19 |
| TW | 201251368 A1 | | 12/2012 | |
| WO | WO 2009/053846 A2 | | 4/2009 | |
| WO | WO 2009/057922 A1 | | 5/2009 | |

OTHER PUBLICATIONS

Office Action dated Mar. 28, 2019 in corresponding Taiwanese Patent Application No. 107104238 (with English Translation of Category of Cited Documents), citing documents AG-AI, AS and AT therein, 9 pages.

Indian Office Action dated Nov. 26, 2020 in Indian Patent Application No. 201927035790, 6 pages.

Combined Chinese Office Action and Search Report dated Aug. 5, 2020 in Patent Application No. 201880000697.9 (with English translation of Categories of Cited Documents), citing document AO therein, 9 pages.

Extended European Search Report dated Mar. 11, 2020 in European Patent Application No. 18748278.1, citing documents AO and AY therein, 8 pages.

European Office Action dated Mar. 31, 2020 in European Patent Application No. 18748278.1, 1 page.

"LDPC HARQ design", Intel Corporation, 3GPP Draft: R1-1700384 LDPC HARQ VFinal , $3^{rd}$ Generation Partnership Project (3GPP) Mobile Competence Center, vol. RAN WG1, XP051207921, Jan. 16, 2017, pp. 1-2.

* cited by examiner

US 11,296,821 B2

METHOD AND APPARATUS FOR COMMUNICATION

INCORPORATION BY REFERENCE

This present disclosure is a continuation application of U.S. application Ser. No. 15/888,733, filed Feb. 5, 2018, which claims the benefit of U.S. Provisional Application No. 62/455,057, "NR LDPC Redundancy Version Design" filed on Feb. 6, 2017, each of which is incorporated herein by reference in its entirety.

TECHNICAL FIELD

The technical field of this invention is about wireless communication technology, more specifically, the error correcting codes in the wireless communication technology.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In wireless communication, electromagnetic signals are used to transmit digital data. The digital data may be incorrectly delivered due to various reasons. In an example, some bits in the digital data can get corrupted due to for example, noise, signal distortion, interference, and the like. Error correcting codes can be used in wireless communication technology for controlling errors in data transmission over unreliable or noisy communication channels.

SUMMARY

Aspects of the disclosure provide an apparatus that includes transmitting circuitry and processing circuitry. The transmitting circuitry is configured to transmit wireless signals. The processing circuitry is configured to encode a set of information bits with a code that is configured for incremental redundancy to generate a code word that includes the information bits and parity bits. Further, the processing circuitry is configured to buffer the code word in a circular buffer, determine a start position in the circular buffer based on a redundancy version that is selected from a plurality of redundancy versions based on a scenario evaluation of a previous transmission associated with the set of information bits, and transmit, via the transmitting circuitry, a selected portion of the code word from the start position.

In an example, the processing circuitry is configured to puncture a portion of the information bits from the code word and buffer the punctured code word in the circular buffer.

According to an aspect of the disclosure, the processing circuitry is configured to encode the set of information bits with a low density parity check (LDPC) code that is configured for incremental redundancy.

In an example, the apparatus includes receiving circuitry configured to receive the redundancy version that is selected by another apparatus.

In an embodiment, the processing circuitry is configured to determine the start position based on the redundancy version that is indicative of a chase combining scheme. In another embodiment, the processing circuitry is configured to determine the start position based on the redundancy version that is indicative of a continuation from a last transmission.

In some examples, the processing circuitry is configured to determine the start position based on a predefined relationship of redundancy versions to positions in the circular buffer. In an example, the processing circuitry is configured to determine the start position that is a predetermined fixed value associated with the selected redundancy version. In another example, the processing circuitry is configured to determine the start position based on a predefined ratio associated with the selected redundancy version, and at least one of a size of the information bits, and a size of the code word. In another example, the processing circuitry is configured to determine the start position based on a predefined integer associated with the selected redundancy version, and a lifting factor that is used to construct the LDPC code.

Aspects of the disclosure provide a method for communication. The method includes encoding, by processing circuitry of an apparatus, a set of information bits with a code that is configured for incremental redundancy to generate a code word that includes the information bits and parity bits, buffering the code word in a circular buffer, determining a start position in the circular buffer based on a redundancy version that is selected from a plurality of redundancy versions based on a scenario evaluation of a previous transmission associated with the set of information bits, and transmitting, via transmitting circuitry of the apparatus, a selected portion of the code word from the start position.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Retransmission can be used in wireless communication to provide reliable communication. Incremental redundancy (IR) scheme is one of the schemes used in retransmission to further improve performance. The incremental redundancy scheme can transmit additional redundant information in each retransmission. The selection of the additional redundant information can be indicated by a redundancy version (RV). Aspects of the disclosure provide a hybrid redundancy version design that defines a plurality of redundancy versions that are suitable for different retransmission scenarios, such as a data decoding failure scenario, a control decoding failure scenario, an acknowledgement failure scenario, a pre-emption scenario, and the like. Before a retransmission, a present retransmission scenario is determined and a redundancy version that is suitable for the present retransmission scenario is selected accordingly. Based on the determined redundancy version, the retransmission is then performed.

Figure 1:
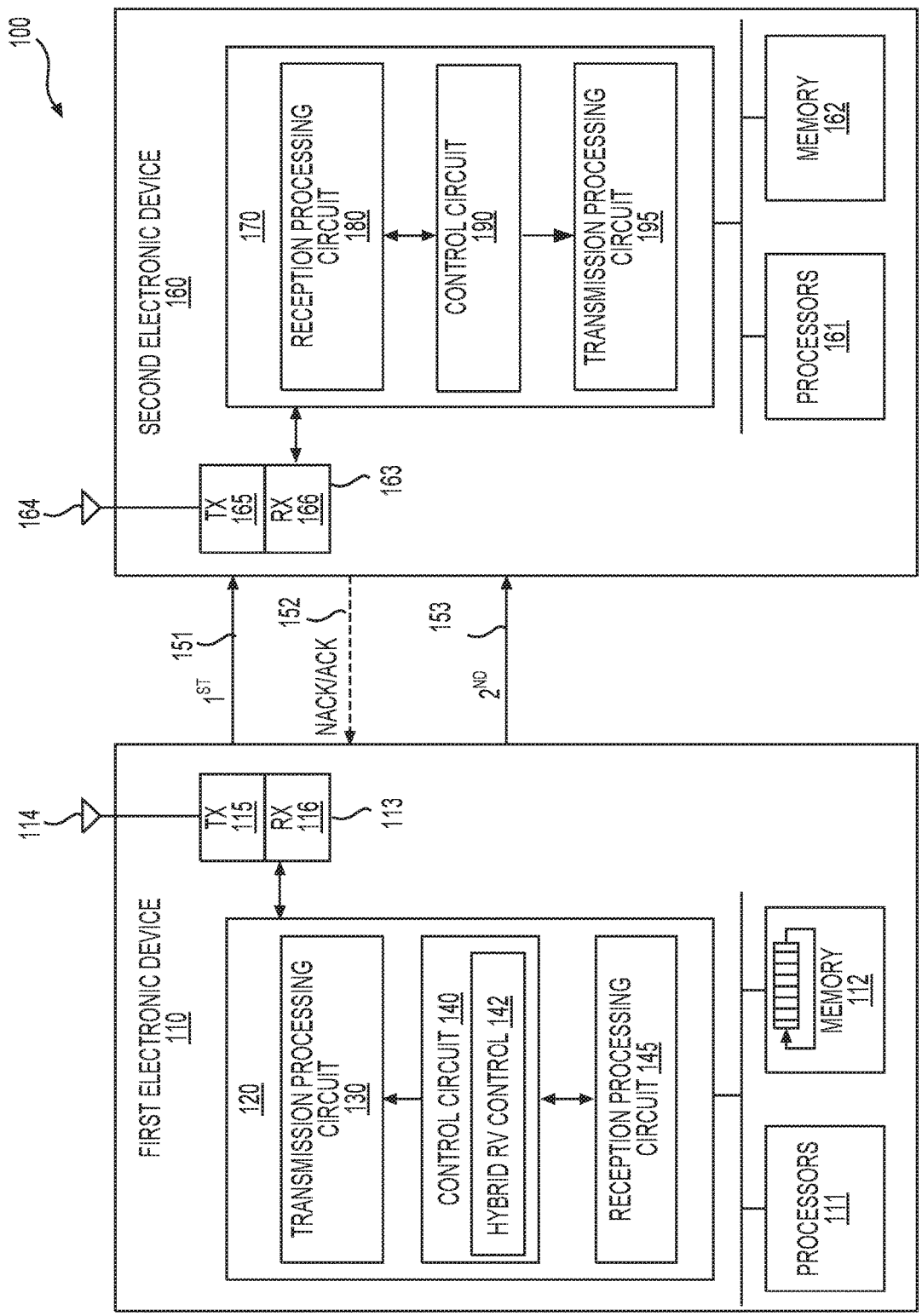
FIG. 1 shows a block diagram of an exemplary communication system 100 according to an embodiment of the disclosure.

FIG. 1 shows a block diagram of an exemplary communication system 100 according to an embodiment of the disclosure. The communication system 100 includes a first electronic device 110 and a second electronic device 160 that are in wireless communication. The first electronic device 110 and the second electronic device 160 are configured to transmit wireless signals carrying digital data and perform retransmissions in response to a reception failure. In some embodiments, the digital data is encoded and the encoded data is configured to form multiple redundancy versions according to a hybrid redundancy version design. The multiple redundancy versions can be selected for an initial transmission or a retransmission of the digital data. For a retransmission scenario, a reason for retransmission is detected. Based on the reason for retransmission, a redundancy version is selected from the multiple redundancy versions. Then, the retransmission is performed based on the selected redundancy version.

The communication system 100 can be any suitable wireless communication system that uses suitable wireless communication technology, such as second generation (2G) mobile network technology, third generation (3G) mobile network technology, fourth generation (4G) mobile network technology, fifth generation (5G) mobile network technology, global system for mobile communication (GSM), long-term evolution (LTE), a New Radio (NR) access technology, a wireless local area network (WLAN), and the like.

In an example, one of the first electronic device 110 and the second electronic device 160 is an interface node in a telecommunication service provider, and the other electronic device is a terminal device. For example, the first electronic device 110 is the interface node, and the second electronic device 160 is the terminal device, or the first electronic device 110 is the terminal device, and the second electronic device 160 is the interface node.

In an example, the interface node, such as a base transceiver station, a Node B, an evolved Node B (eNB), a next generation Node B (gNB), and the like, includes hardware components and software components configured to enable wireless communications between the interface node and electronic devices that have subscribed services of the telecommunication service provider. The interface node is suitably coupled with other nodes, such as core nodes, other interface nodes, and the like of the telecommunication service provider.

In an example, the terminal device is user equipment used by an end-user for mobile telecommunication, such as a cell phone, a smart phone, a tablet computer, a laptop, a wearable device and the like. In another example, the terminal device is a stationary device, such as a desktop computer. In another example, the terminal device is a machine type communication device, such as a wireless sensor, an Internet of things (IoT) device and the like.

In some examples, the first electronic device 110 needs to transmit a data unit, such as a code block having a set of information bits, to the second electronic device 160. The first electronic device 110 encodes the data unit to generate an encoded data unit. In an example, the encoded data unit includes the information bits in the data unit, and includes parity bits that carry redundancy information for error correction.

According to as aspect of the disclosure, the first electronic device 110 uses a hybrid redundancy version design to define multiple redundancy versions in the encoded data unit.

Figure 2:
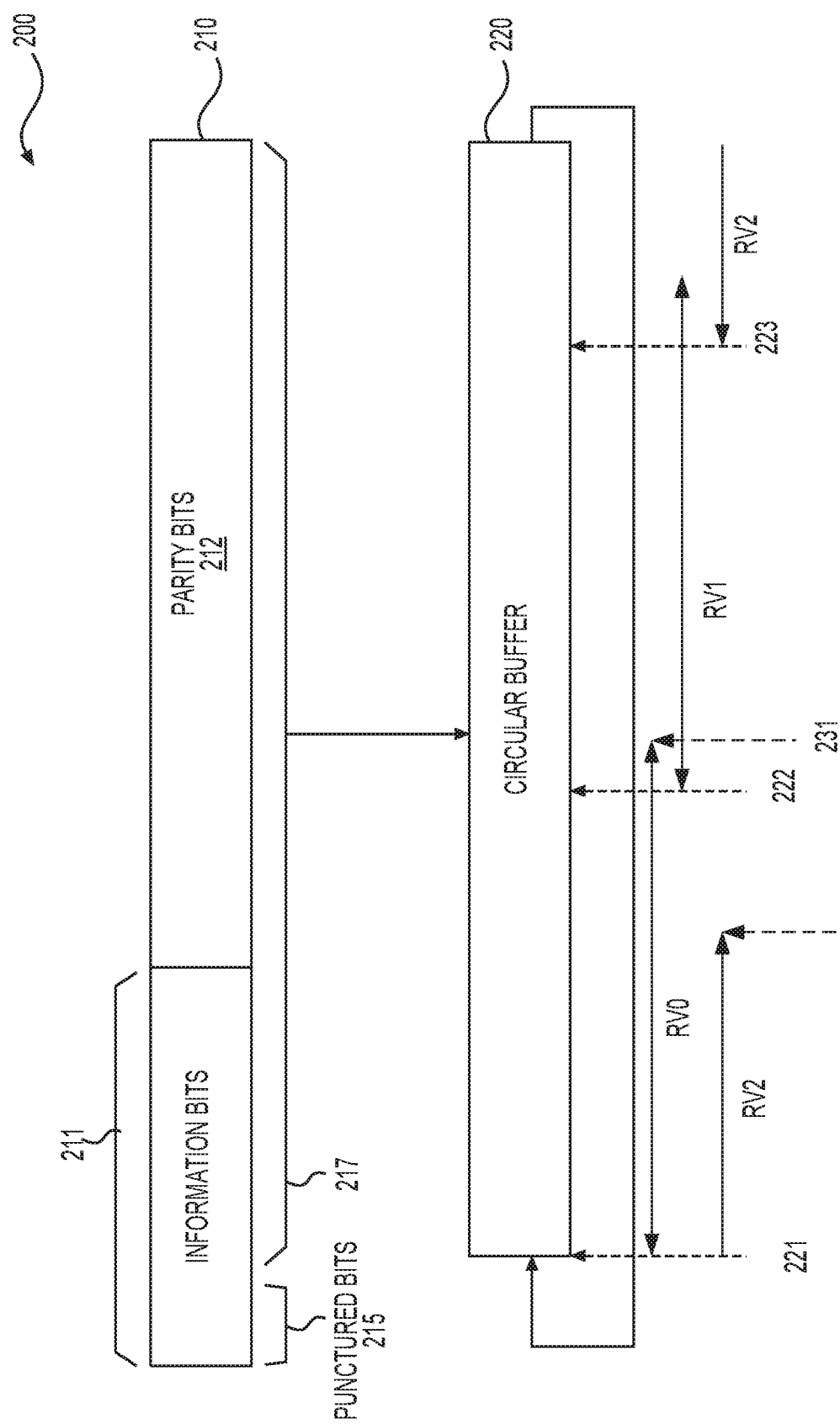
FIG. 2 shows a diagram of a hybrid redundancy version design according to an embodiment of the disclosure.

FIG. 2 shows a diagram 200 of a hybrid redundancy version design according to an embodiment of the disclosure. The diagram 200 shows a code block 211 having a set of information bits. The code block 211 is encoded to generate an encoded code block 210. The encoded code block 210 includes the set of information bits and parity bits 212. In an example, a portion of the encoded code block 210, such as a portion of the information bits as shown by 215, is punctured and the rest of the encoded code block 210, as shown by 217, is buffered in a circular buffer 220. In an example, the circular buffer 220 is implemented by allocating a memory space in a memory device to form the circular buffer. In some examples, the circular buffer 220 is referred to as a virtual circular buffer.

In the FIG. 2 example, the encoded code block in the circular buffer 220 is configured according to the hybrid redundancy version design to form multiple redundancy versions RV0-RV4. In the FIG. 2 example, the redundancy versions RV0-RV2 are redundancy versions having pre-defined indexes, and the redundancy versions RV3 and RV4 depend on the redundancy version of the last transmission (or last retransmission).

In an example, the redundancy versions RV0-RV2 are defined according to the start positions. In the FIG. 2 example, the redundancy version RV0 is defined by a start position as shown by 221, the redundancy version RV1 is defined by a start position as shown by 222, and the redundancy version RV2 is defined by a start position as shown by 223. In an embodiment, the start positions are indicated by fixed values. In an example, the fixed values are indicative of start positions for the redundancy versions RV0-RV2 in the circular buffer 220.

In another example, the start positions are defined based on ratios to a total size. In an example, the total size can be the size of the code block 211, the size of the encoded block 210, or the size of the circular buffer 220.

In another example, the information bits are encoded based on a LDPC code. In some examples, a specific class of LDPC codes that are constructed from a template are used, the template is referred to as protograph, and the specific class of LDPC codes are referred to as protograph LDPC codes. The protograph serves as a blueprint for constructing LDPC codes of different sizes. A protograph LDPC code can be generated based on a lifting factor (Z), and the lifting factor can be used to indicate the size of the protograph. The start positions of the redundancy versions RV0-RV2 are defined to be proportional to the lifting factor. In an example, the start position of a redundancy version is identified by an integer number of lifting factor.

Further, in the FIG. 2 example, the redundancy version RV3 is defined to continue from the redundancy version of the last transmission for the code block. For example, when the last transmission has the redundancy version RV0, and the redundancy version RV3 is used for the next retransmission, the next retransmission (corresponding to the redundancy version RV3) starts after the last bit of the redundancy version RV0, as shown by 231. When the last transmission has the redundancy version RV2 and the redundancy version RV3 is used for the next retransmission, the next retransmission (corresponding to the redundancy version RV3) starts after the last bit of the redundancy version RV2, as shown by 233.

Further, in the FIG. 2 example, the redundancy version RV4 is defined to repeat the redundancy version in the last transmission for the code block. For example, when the last transmission has the redundancy version RV0 and the redundancy version RV4 is used for the next retransmission, the next retransmission (corresponding to the redundancy version RV4) has the same redundancy version as the redundancy version RV0, and starts at the same start position 221 as the redundancy version RV0. When the last transmission has the redundancy version RV2 and the redundancy version RV4 is used for the next retransmission, the next retransmission (corresponding to the redundancy version RV4) has the same redundancy version as the redundancy version RV2 and starts at the same start position 223 as the redundancy version RV2.

Referring back to FIG. 1 example, the first electronic device 110 conducts a first transmission 151 of an initial redundancy version (RV0). In an example, the initial redundancy version includes the information bits of the data unit and a portion of the parity bits. The first transmission 151 transmits wireless signals carrying the initial redundancy version. The second electronic device 160 receives wireless signals that carry the initial redundancy version. The received wireless signals can be corrupted due to for example, noise, signal distortion, interference, and the like. The second electronic device 160 decodes the received signals, and performs error correction based on the portion of the parity bits. In an example, when the second electronic device 160 successfully corrects all of the errors, the second electronic device 160 transmits wireless signals 152 carrying an acknowledgement (ACK) to indicate the decoding success. However, when the second electronic device 160 fails to correct all of the errors, the second electronic device 160 transmits wireless signals 152 carrying a negative acknowledgement (NACK) to indicate the decoding failure.

In some embodiments, the first electronic device 110 is configured to detect retransmission scenarios, and determine reasons for the retransmission scenarios. In an example, the first electronic device 110 receives wireless signals 152 in response to previous transmission/retransmissions of redundancy versions of the encoded data unit, and detects an NACK that is carried by the wireless signals 152. The first electronic device 110 can determine that the second electronic device 160 fails to decode the data unit (referred to as a data decoding failure scenario), and a retransmission is needed.

In another example, the first electronic device 110 receives the wireless signals 152 that are corrupted during transmission. The first electronic device 110 recognizes that the corrupted wireless signals 152 carry feedback information but fails to determine whether the corrupted wireless signals 152 carry ACK or NACK. The first electronic device 110 determines an acknowledgement failure scenario, and a retransmission is needed.

In another example, the first electronic device 110 does not receive wireless signals 152 that carry ANK or NACK in response to the first transmission 151. For example, the first electronic device 110 is a gNB and the first transmission 151 includes control information (e.g., downlink control information) with the initial redundancy version of the encoded data unit. The control information indicates that the first transmission 151 carries data to the second electronic device 160. The second electronic device 160 fails to decode the control information, and does not recognize that the first transmission 151 carries data that is destined to the second electronic device 160. Thus, the second electronic device 160 does not respond to the first transmission 151. In the example, when the first electronic device 110 does not receive any feedback signal in response to the first transmission 151, the first electronic device 110 detects a control decoding failure scenario, and a retransmission is need.

In another example, the first electronic device 110 detects a pre-emption scenario that can cause reception failure, and a retransmission is need. In an example, the first electronic device 110 is a gNB, and needs to transmit information to an electronic device (not shown) that is installed on a vehicle, and the transmission to the electronic device on the vehicle is categorized as an ultra-reliable and low latency (URLLC) transmission. The first electronic device 110 then overwrites information carried by some radio resources in the first transmission 151 to ensure the URLLC transmission. Thus, the first electronic device 110 detects the pre-emption scenario that can cause reception failure, and a retransmission is need.

According to an aspect of the disclosure, the first electronic device 110 selects a redundancy version based on the reason for retransmission, and conducts a second transmission 153 according to the selected redundancy version.

In an example, when the first electronic device 110 detects the data decoding failure scenario, the first electronic device 110 selects the redundancy version RV3. When the first electronic device 110 detects the acknowledgement failure scenario, the first electronic device 110 selects one of the redundancy versions RV0-RV2. When the first electronic device 110 detects the control decoding failure scenario, the first electronic device 110 selects the redundancy version RV4. When the first electronic device 110 detects the pre-emption scenario, the first electronic device 110 selects the redundancy version RV4.

It is noted that in some embodiments, the second electronic device 160 detects the retransmission scenario, determines the reason for retransmission and selects a redundancy version accordingly. The second electronic device 160 can transmit signals that are indicative of the selected redundancy version to the first electronic device 110. Thus, the first electronic device 110 can perform retransmission according to the selected redundancy version.

In the FIG. 1 example, the first electronic device 110 transmits the data unit, and the second electronic device 160 receives the data unit. It is noted that the second electronic device 160 can be configured to transmit a data unit and the first electronic device 110 can be configured to receive the data unit in the same or similar manner in the example.

Specifically, in the FIG. 1 example, the first electronic device 110 includes a first transceiver 113 and a first baseband processing circuit 120 coupled together. The first electronic device 110 includes other suitable components, such as processors 111, memory 112, and the like. In the FIG. 1 example, the components are coupled together by a bus architecture. It is noted that other suitable interconnection techniques can be used.

The second electronic device 160 includes a second transceiver 163 and a second baseband processing circuit 170 coupled together. The second electronic device 160 includes other suitable components, such as processors 161, memory 162, and the like. In the FIG. 1 example, the components are coupled together by a bus architecture. It is noted that other suitable interconnection techniques can be used.

Further, in the example, the first baseband processing circuit 120 includes a transmission processing circuit 130, a reception processing circuit 145 and a control circuit 140 coupled together. The control circuit 140 includes a hybrid RV control module 142 configured to detect a retransmission scenario, determine the reason for retransmission, and select a redundancy version in a hybrid redundancy design for the retransmission.

The second baseband processing circuit 170 includes a reception processing circuit 180, a transmission processing circuit 195, a control circuit 190 coupled together.

The first transceiver 113 is configured to receive and transmit wireless signals. In an example, the first transceiver 113 includes a receiving circuit RX 116 and a transmitting circuit TX 115. The receiving circuit RX 116 is configured to generate electrical signals in response to captured electromagnetic waves by an antenna 114, and process the electrical signals to extract digital samples from the electrical signals. For example, the receiving circuit RX 116 can filter, amplify, down convert, and digitalize the electrical signals to generate the digital samples. The receiving circuit RX 116 can provide the digital samples to the first baseband processing circuit 120 for further processing.

In an example, the transmitting circuit TX 115 is configured to receive digital stream (e.g., output samples) from the first baseband processing circuit 120, process the digital stream to generate radio frequency (RF) signals, and cause the antenna 114 to emit electromagnetic waves in the air to carry the digital stream. In an example, the transmitting circuit TX 115 can convert the digital stream to analog signals, and amplify, filter and up-convert the analog signals to generate the RF signals.

In some embodiments, the transmission processing circuit 130 is configured to receive a transport block (e.g., a packet), and generate the digital stream corresponding to the transport block. In an example, the processors 111 execute software instructions to form upper layers of a protocol stack (e.g., data link layer, network layer, transport layer, application layer and the like), and the processors 111 generate a transport block following the protocol stack. In an example, the bottom of the upper layers of protocol stack is a data link layer, the data link layer outputs the transport block, and the processors 111 provide the transport block to the first baseband processing circuit 120. The first baseband processing circuit 120 forms a physical layer for the protocol stack in an example. The transmission processing circuit 130 receives the transport block and processes the transport block to generate the digital stream, and provide the digital stream to the transmitting circuit TX 115 for transmission.

The reception processing circuit 145 is configured to receive the digital samples from the receiving circuit 116 and process the received digital samples.

In an example, the transmission processing circuit 130 partitions the transport block into a plurality of code blocks. The transmission processing circuit 130 then processes the code blocks according to suitable coding and modulation scheme. For example, the code blocks can be encoded for example using suitable channel coding techniques, such as error detection coding technique, rate matching coding technique, low density parity check (LDPC) coding technique, polar coding technique and the like. The processed code blocks are suitably modulated and multiplexed to generate the digital stream. For example, the code blocks can be modulated using suitable modulation technique, such as quadrature phase shift keying (QPSK), quadrature amplitude modulation (QAM), 16 QAM, 64 QAM, 256 QAM, and can be multiplexed using suitable multiplexing technique, such as frequency-division multiplexing (FDM), time-division multiplexing (TDM), a combination of FDM and TDM, and the like.

Additionally, in the FIG. 1 example, the transmission processing circuit 130 is configured to generate the digital stream based on control signals from the control circuit 140. In an example, a code block is encoded and the encoded code block is buffered, for example in a circular buffer that is formed in the memory 112. The encoded code block forms multiple redundancy versions according to a hybrid redundancy version design, such as the hybrid redundancy version design shown in FIG. 2. The control circuit 140 can determine a redundancy version, and provide the redundancy version to the transmission processing circuit 130. Then the transmission processing circuit 130 can generate the digital stream based on the redundancy version.

Specially, in an example, after a transmission of a redundancy version of the encoded code block, the control circuit 140 monitors the reception processing circuit 145 for acknowledgement and/or negative acknowledgement in response to the transmission. When the control circuit 140 detects an NACK, the control circuit 140 detects a data decoding failure scenario, and selects a redundancy version accordingly. When the control circuit 140 detects feedback signals, but is not sure whether the feedback signals carry ACK or NACK, the control circuit 140 detects an acknowledgement failure scenario, and selects a redundancy version accordingly. When the control circuit 140 does not detect any feedback signals in response to the transmission, the control circuit 140 detects a control decoding failure scenario, and selects a redundancy version accordingly. The control circuit 140 can provide the control signals to the transmission processing circuit 130, such that the transmission processing circuit 130 can select a portion of the encoded code block from the circular buffer based on the selected redundancy version, and process the selected portion for a next transmission.

Similarly, the second transceiver 163 is configured to receive and transmit wireless signals. In an example, the second transceiver 163 includes a receiving circuit RX 166 and a transmitting circuit TX 165. The receiving circuit RX 166 is configured to generate electrical signals in response to captured electromagnetic waves by an antenna 164, and process the electrical signals to extract digital samples from the electrical signals. For example, the receiving circuit RX 166 can filter, amplify, down convert, and digitalize the electrical signals to generate the digital samples. The receiving circuit RX 166 can provide the digital samples to the second baseband processing circuit 170 for further processing.

In an example, the transmitting circuit TX 165 is configured to receive a digital stream (e.g., output samples) from the second baseband processing circuit 170, process the digital stream to generate radio frequency (RF) signals, and cause the antenna 164 to emit electromagnetic waves in the air to carry the digital stream. In an example, the transmitting circuit TX 165 can convert the digital stream to analog signals, and amplify, filter and up-convert the analog signals to generate the RF signals.

In the FIG. 1 example, the second baseband processing circuit 170 is configured to receive and process digital samples received from the receiving circuit RX 166 and provide digital streams to the transmitting circuit TX 165. In an embodiment, in the second baseband processing circuit 170, the reception processing circuit 180 is configured to receive the digital samples, process the digital samples to generate a decoded data unit and provide the decoded data unit to the processors 161 for further processing. In an example, the processors 161 execute software instructions to form upper layers of a protocol stack, and the processors 161 can process the decoded data unit following the protocol stack. In an example, the second baseband processing circuit 170 forms a physical layer for the protocol stack, the bottom of the upper layers formed by the processors 161 is a data link layer. The physical layer can output the data unit in the form of a transport block and provide the transport block to the data link layer for further processing.

In an embodiment, the reception processing circuit 180 receives first digital samples of the initial transmission, de-multiplexes and demodulates the first digital samples to generate a first received code block, and decodes the first received code block. In an example, when the code block is received with success, the first received code block is decoded without error, then the second electronic device 160 sends the ACK to inform the first electronic device 110. However, when the code block is decoded with errors, the second electronic device 160 sends the NACK to indicate receiving errors.

It is noted that the first baseband processing circuit 120 and the second baseband processing circuit 170 can be respectively implemented using various techniques. In an example, a baseband processing circuit is implemented as integrated circuits. In another example, a baseband processing circuit is implemented as one or more processors executing software instructions.

It is also noted that while single antenna per device is used in the FIG. 1 example, the communication 100 can be suitably modified to use multiple input, multiple output (MIMO) antenna technology.

Figure 3:
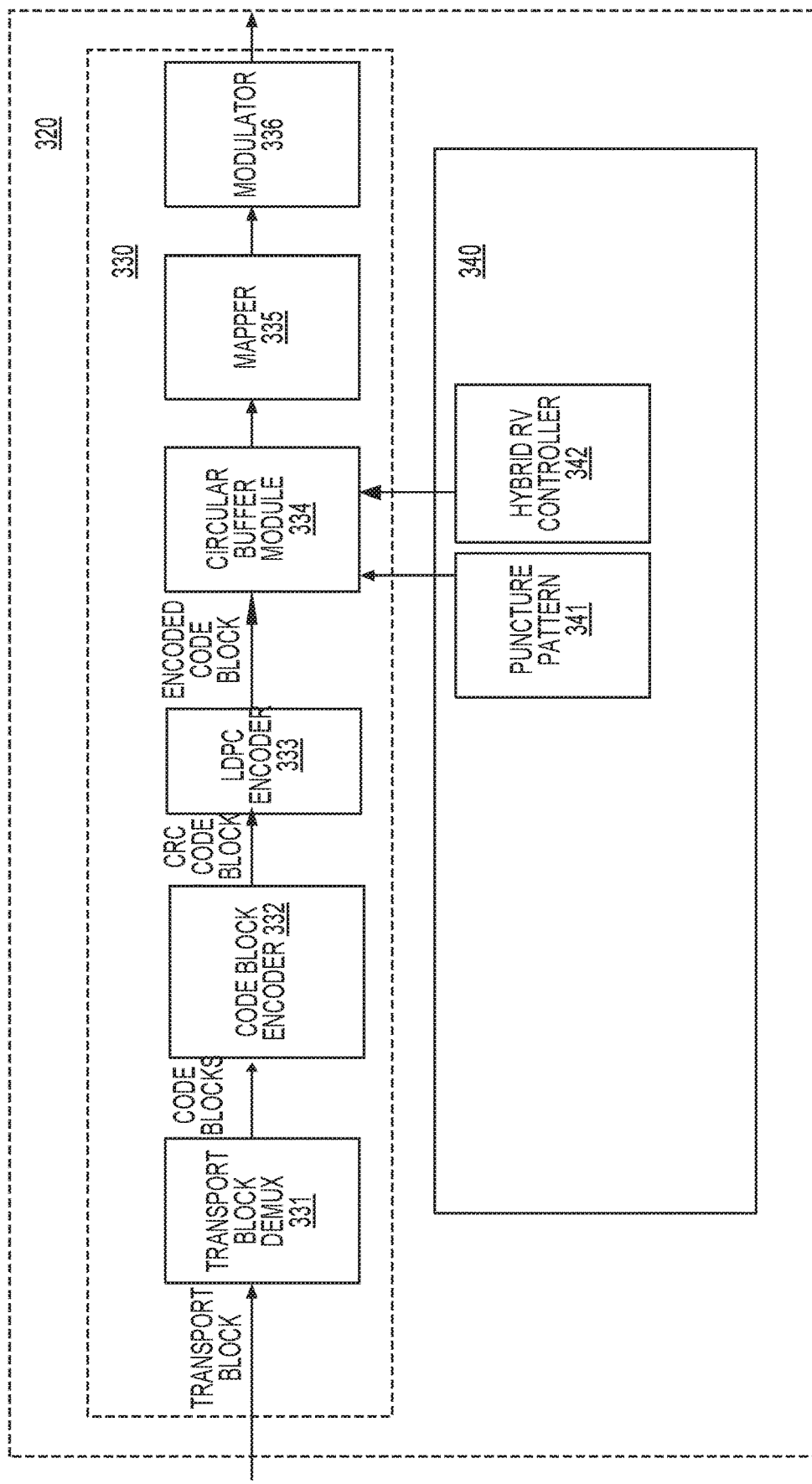
FIG. 3 shows a block diagram of a baseband processing circuit 320 according to an embodiment of the disclosure.

FIG. 3 shows a block diagram of an exemplary baseband processing circuit 320 according to an embodiment of the disclosure. In an example, the baseband processing circuit 320 is used in the first electronic device 110 in the place of the first baseband processing circuit 120.

The baseband processing circuit 320 includes a transmission processing circuit 330 and a control circuit 340 coupled together as shown in FIG. 3. The transmission processing circuit 330 includes a transport block de-multiplexer (DE-MUX) 331, a code block encoder 332, a low-density parity-check (LDPC) encoder 333, a circular buffer module 334, a mapper 335 and a modulator 336 coupled together. The control circuit 340 includes various control modules for configuring and controlling operations of the baseband processing circuit 320. In the FIG. 3 example, the control circuit 340 includes a puncture pattern controller 341, a hybrid RV controller 342, and the like.

The transport block DEMUX 331 is configured to receive a transport block of a data packet, encode the transport block for transport block level error detection, and partition the encoded transport block to output a plurality of code blocks. In an example, the transport block DEMUX 331 is configured to calculate cyclic redundancy check (CRC) bits based on the transport block, and add the CRC bits into the transport block to generate the encoded transport block. Further, the transport block DEMUX 331 is configured to partition the encoded transport block into a plurality of code blocks. The plurality of code blocks are respectively processed by the code block encoder 332, the LDPC encoder 333, the circular buffer module 334, and the mapper 335 in an example.

It is noted that, in another example, the code block encoder 332, the LDPC encoder 333, the circular buffer module 334 and the mapper 335 form a code block processing path. The baseband processing circuit 320 includes multiple code block processing paths that are configured to parallel process the plurality of code blocks. Then, the modulator 336 can multiplex output from the multiple code block processing paths.

In an example, the code block encoder 332 is configured to receive a code block, encode the code block for code block level error detection to generate a CRC code block. In an example, the code block encoder 332 is configured to calculate cyclic redundancy check (CRC) bits based on the code block, and add the CRC bits into the code block to generate the CRC code block. In an example, bits in the CRC code block are referred to as information bits.

The LDPC encoder 333 is configured to operate on the CRC code block using an LDPC code to enable error correction. In an example, the LDPC code is defined by a parity-check matrix consisting of elements 0 and 1. In an example, the LDPC code is an M by N matrix that includes M rows and N columns, where M and N are positive integers. The LDPC encoder 333 receives the information bits (encoded code block) having a bit length of K=N−M, and encodes the information bits based on the LDPC code to generate a code word (encoded information bits) having a bit length of N. In an example, the first K bits in the code word are the information bits, and the rest of the bits are parity bits.

According to an aspect of the disclosure, the LDPC code is a quasi-cyclic LDPC (QC-LDPC) code which is a sub-class of protograph LDPC codes. The QC-LDPC code can be constructed from a base matrix (template) and one or more shift-coefficient tables. In an example, the base matrix is a relative small matrix of binary values. Binary "1" at a position of the base matrix indicates that a quasi-cyclic (QC) matrix can be constructed at the position to form the LDPC code, and binary "0" at a position of the base matrix indicates that a matrix of zero values can be constructed at the position to form the LDPC code. A shift-coefficient table includes column-shifting values for positions in the base matrix to construct QC matrix. For example, when the shift-coefficient table includes "0" for a position in the base matrix, then the QC matrix for the position can be constructed by cyclic shifting columns in an identity matrix by "0" column. Similarly, when the shift-coefficient table includes "2" for a position in the base matrix, then the QC matrix for the position can be constructed by cyclic shifting columns in an identify matrix by "2" columns.

The QC matrix has a size that can be adjusted based on a length of information bits. The size of the QC matrix is referred to as lifting factor.

The circular buffer module 334 is configured to buffer the code word in a circular buffer, and output a selected portion of the buffered code word based on a redundancy version. In an example, the circular buffer is formed in a memory, such as the memory 112. In an example, a memory space in the memory 112 is allocated to form the circular buffer. The circular buffer is referred to as virtual circular buffer in some examples.

In some embodiments, the code word is punctured, and punctured code word is buffered in the circular buffer. In an example, the two columns worth of information bits are punctured before buffering. The puncture of information bits can provide a performance advantage.

The symbol mapper 335 maps the selected portion of the code block (corresponding to the selected redundancy version) to data symbols according to suitable modulation scheme. The modulator 336 then performs modulation on the data symbols and generates output samples.

The control circuit 340 can provide control signals to the transmission processing circuit 330. For example, the control circuit 340 provides control signals to the circular buffer module 334 to select a portion of the buffered code word based on a redundancy version.

In an example, the control circuit 340 receives a redundancy version that is extracted from received signal. In another example, the control circuit 340 detects a retransmission scenario, determines a reason for the retransmission, and selects the redundancy version accordingly.

It is noted that the baseband processing circuit 320 can be implemented using various techniques. In an example, the baseband processing circuit 320 is implemented as integrated circuits. In another example, the baseband processing circuit 320 is implemented as one or more processors executing software instructions.

Figure 4:
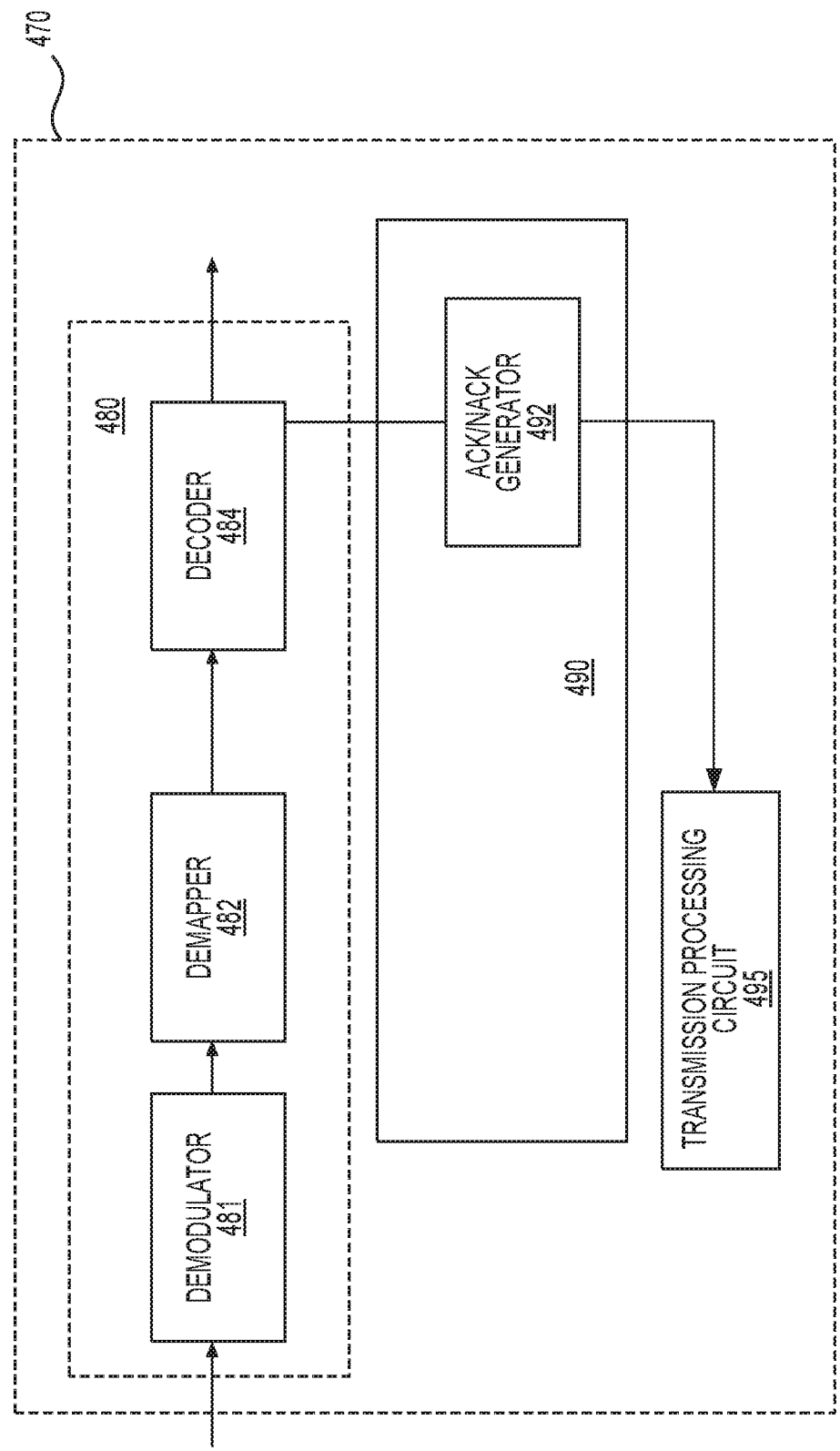
FIG. 4 shows a block diagram of a baseband processing circuit 470 according to an embodiment of the disclosure.

FIG. 4 shows a block diagram of an exemplary baseband processing circuit 470 according to an embodiment of the disclosure. In an example, the baseband processing circuit 470 is used in the second electronic device 160 in the place of the second baseband processing circuit 170.

The baseband processing circuit 470 includes a reception processing circuit 480, a transmission processing circuit 495 and a control circuit 490 coupled together as shown in FIG. 4. The reception processing circuit 480 further includes a demodulator 481, a de-mapper 482, a decoder 484 coupled together as shown in FIG. 4. The control circuit 490 includes an ACK/NACK generator 492.

In an embodiment, the baseband processing circuit 470 receives first digital samples corresponding to an initial transmission of a redundancy version of a code block, and process the first digital samples to generate first decoded code block. For example, the demodulator 481 is configured to receive the first digital samples, perform demodulation on the first digital samples to generate data symbols during each of the symbol periods. The demapper 482 separates data symbols for the subcarriers during each symbol period, and determines data symbols respectively for the code block, and provides the data symbols corresponding to the code block to the decoder 484.

The decoder 484 processes data symbols for the code block to decode the code block. For example, the decoder 484 can perform statistical computation, such as log-likelihood ratio computation on the received data symbols, and decode the code block based on the statistical computations in an example. The decoders 484 can also check whether the decoding of the code block is successful for example based on the error detection at the code block level.

In the FIG. 4 example, the error detection results are provided to the ACK/NACK generator 492 to generate ACK or NACK. The transmission processing circuit 495 can generate digital samples in response to the ACK or NACK.

Further, the decoder 484 is configured to combine received data symbols from multiple transmissions of same or different redundancy versions and decode the code block based on the combined data symbols.

It is noted that the baseband processing circuit 470 can be implemented using various techniques. In an example, the baseband processing circuit 470 is implemented as integrated circuits. In another example, the baseband processing circuit 470 is implemented as one or more processors executing software instructions.

Figure 5:
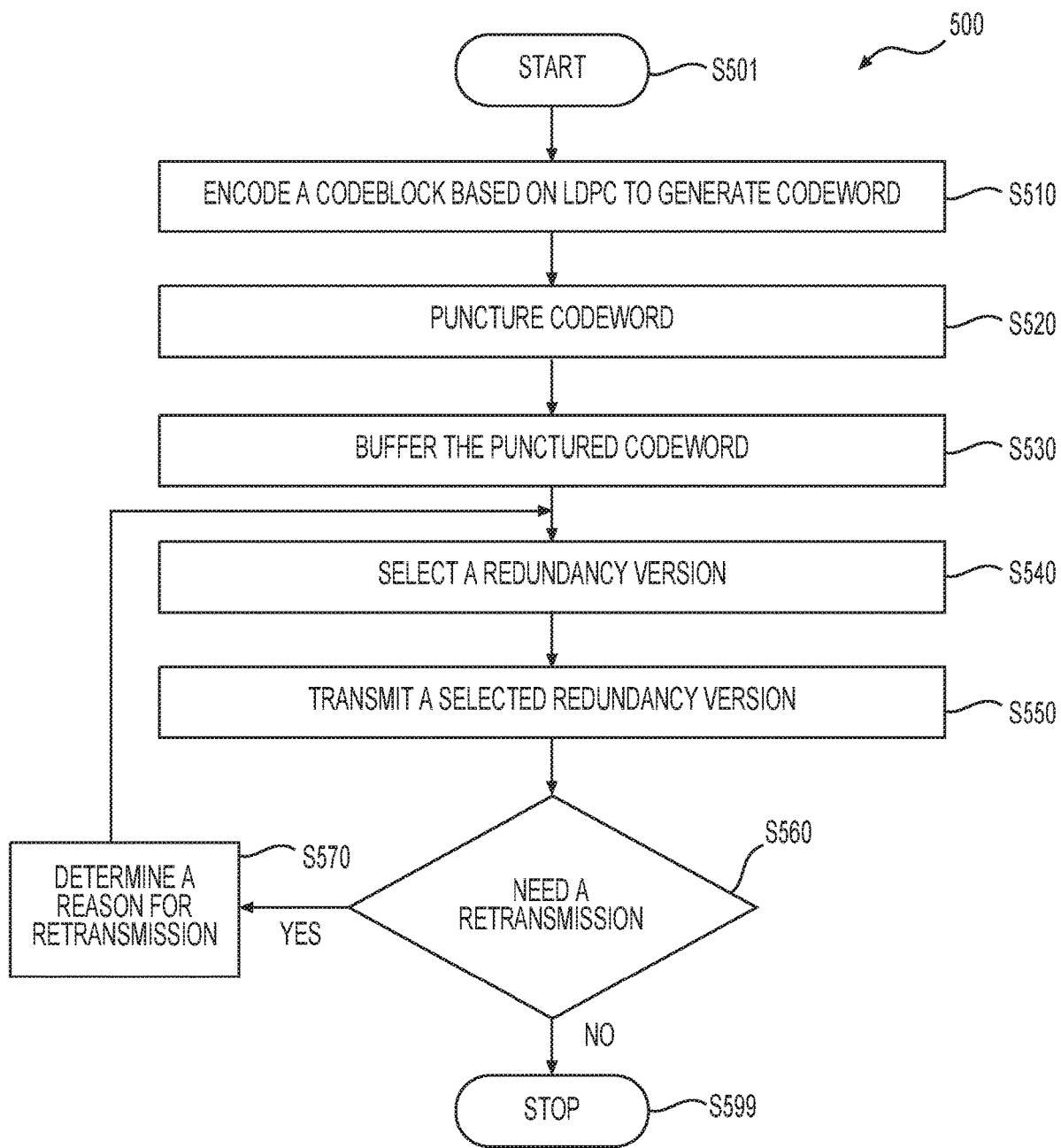
FIG. 5 shows a flow chart outlining a process example 500 according to an embodiment of the disclosure.

FIG. 5 shows a flow chart outlining a process 500 according to an embodiment of the disclosure. In an example, the process 500 is executed by an electronic device, such as the first electronic device 110 in the FIG. 1 example. The process starts at S501 and proceeds to S510.

At S510, a code block is encoded based on an LDPC code to generate a code word. In the FIG. 1 example, a transport block is encoded to add CRC bits. The encoded transport block is partitioned into a plurality of code blocks. For each code block, the first electronic device 110 adds CRC bits in the code block to generate a CRC code block. The bits in the CRC code block are referred to as information bits. The CRC code block is encoded based on an LDPC code to generate a code word. The code word includes the information bits and parity bits.

At S520, the code word is punctured. In an example, two columns worth of information bits are punctured to improve code rate.

At S530, the punctured code word is buffered. In an example, the punctured code word is buffered in a circular buffer. The punctured code word is configured to form multiple redundancy versions according to a hybrid redundancy version design, such as the hybrid redundancy version design shown in FIG. 2.

At S540, a redundancy version is selected. For an initial transmission, an initial redundancy version, such as RV0 is selected.

At S550, the selected redundancy version is transmitted.

At S560, the first electronic device 110 determines whether a re-transmission is needed. When a retransmission is needed, the process proceeds to S570; otherwise, the process proceeds to S599 and terminates.

At S570, a reason for retransmission (retransmission scenario) is determined and the process returns to S540 to select a redundancy version based on the retransmission scenario.

Figure 6:
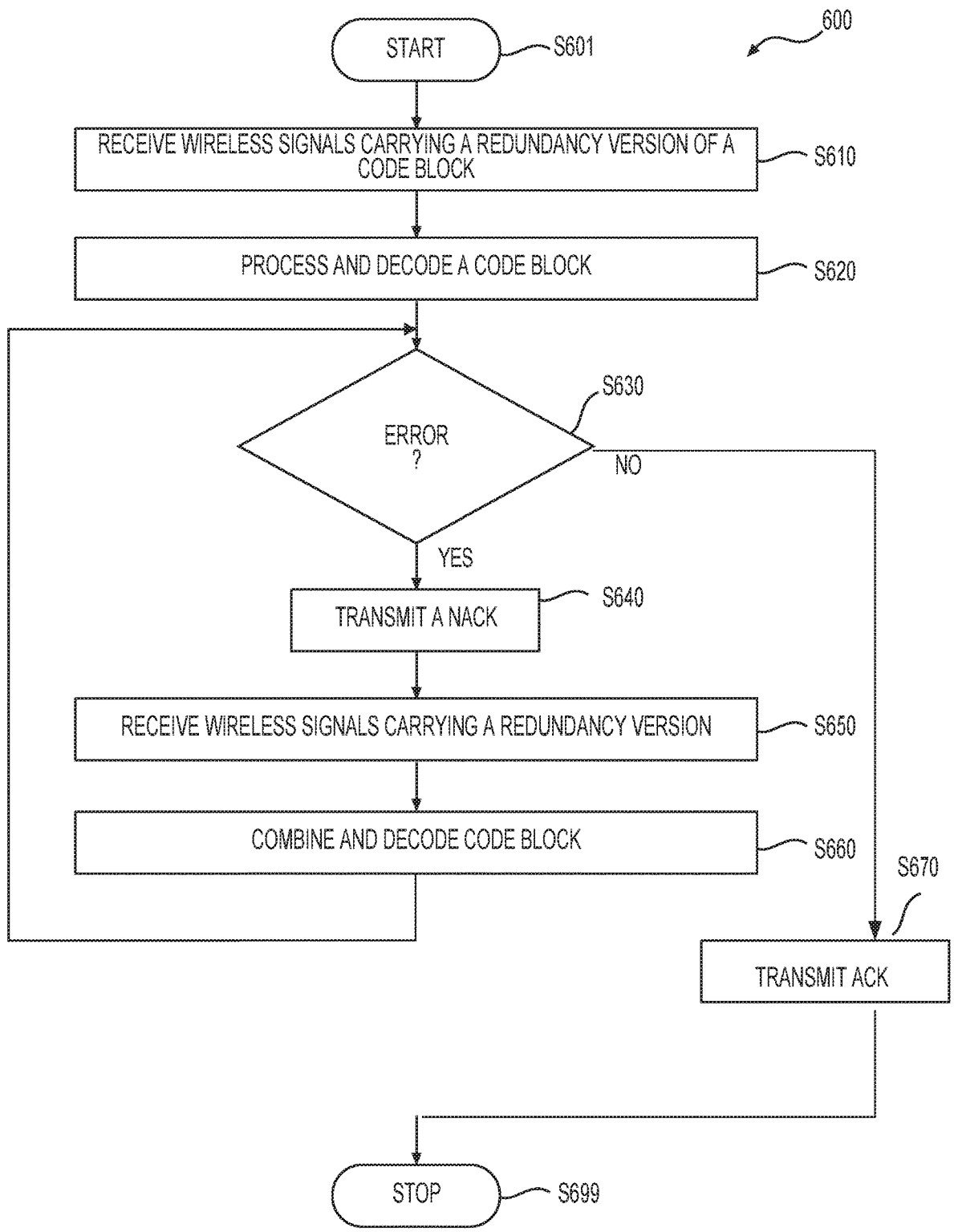
FIG. 6 shows a flow chart outlining a process example 600 according to an embodiment of the disclosure.

FIG. 6 shows a flow chart outlining a process 600 according to an embodiment of the disclosure. In an example, the process 600 is executed by an electronic device, such as the second electronic device 160 in the FIG. 1 example. The process starts at S601 and proceeds to S610.

At S610, wireless signals of a transmission of a redundancy version for a code block are received.

At S620, the wireless signals are processed, and the code block is decoded.

At S630, the electronic device detects whether the code block is decoded with success. In an example, the code block includes CRC bits, and the electronic device detects errors based on the CRC bits. When errors are detected, the process proceeds to S640; otherwise, the process proceeds to S670.

At S640, a negative acknowledgement is transmitted.

At S650, wireless signals of a retransmission of another redundancy version for the code block is received.

At S660, the retransmission is combined with previous transmission and retransmissions. The code block is decoded based on the combined transmissions. Then the process returns to S630.

At S670, an acknowledgement is transmitted, and the process proceeds to S699 and terminates.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:
   transmitting circuitry configured to transmit wireless signals; and
   processing circuitry configured to:
      encode a set of information bits according to a low density parity check (LDPC) code and a lifting factor for constructing the LDPC code to generate a code word that includes the set of information bits and parity bits;

buffer the code word in a circular buffer;

determine a start position in the circular buffer based on a redundancy version that is selected from a plurality of redundancy version candidates based on a scenario evaluation of a previous transmission associated with the set of information bits; and transmit, via the transmitting circuitry, a selected portion of the code word from the start position, wherein the plurality of redundancy version candidates includes a first redundancy version candidate indicating the start position being determined according to a predetermined position, and the predetermined position is determined according to a number that is proportional to the lifting factor.

2. The apparatus of claim 1, wherein the plurality of redundancy version candidates further includes a second redundancy version candidate indicating the start position being determined according to repeating a last transmission or continuing from the last transmission.

3. The apparatus of claim 1, wherein the processing circuitry is configured to:

puncture a portion of the set of information bits from the code word; and buffer the punctured code word in the circular buffer.

4. The apparatus of claim 1, further comprising:

receiving circuitry configured to receive the redundancy version that is selected by another apparatus.

5. The apparatus of claim 1, wherein the processing circuitry is configured to:

determine the start position based on the redundancy version that is indicative of a chase combining scheme.

6. The apparatus of claim 1, wherein the predetermined position is determined further according to a size of the set of information bits or a size of the code word.

7. The apparatus of claim 1, wherein the processing circuitry is configured to:

determine a control channel decoding scenario; and select the redundancy version based on the control channel decoding scenario.

8. The apparatus of claim 1, wherein the plurality of redundancy version candidates further includes a third redundancy version candidate indicating the start position being a start position of the circular buffer.

9. A method, comprising:

encoding, by processing circuitry of an apparatus, a set of information bits according to a low density parity check (LDPC) code and a lifting factor for constructing the LDPC code to generate a code word that includes the set of information bits and parity bits;

buffering the code word in a circular buffer;

determining a start position in the circular buffer based on a redundancy version that is selected from a plurality of redundancy version candidates based on a scenario evaluation of a previous transmission associated with the set of information bits; and transmitting, via transmitting circuitry of the apparatus, a selected portion of the code word from the start position, wherein the plurality of redundancy version candidates includes a first redundancy version candidate indicating the start position being determined according to a predetermined position, and the predetermined position is determined according to a number that is proportional to the lifting factor.

10. The method of claim 9, wherein the plurality of redundancy version candidates further includes a second redundancy version candidate indicating the start position being determined according to repeating a last transmission or continuing from the last transmission.

11. The method of claim 9, wherein buffering the code word in the circular buffer further comprises:

puncturing a portion of the set of information bits from the code word; and buffering the punctured code word in the circular buffer.

12. The method of claim 9, further comprising:

receiving the redundancy version that is selected by another apparatus.

13. The method of claim 9, wherein the determining the start position comprises:

determining the start position based on the redundancy version that is indicative of a chase combining scheme.

14. The method of claim 9, wherein the predetermined position is determined further according to a size of the set of information bits or a size of the code word.

15. The method of claim 9, further comprising:

determining a control channel decoding scenario; and selecting the redundancy version based on the control channel decoding scenario.

16. The method of claim 9, wherein the plurality of redundancy version candidates further includes a third redundancy version candidate indicating the start position being a start position of the circular buffer.

* * * * *